(12) United States Patent
Ozalevli et al.

(10) Patent No.: US 7,348,909 B2
(45) Date of Patent: Mar. 25, 2008

(54) RECONFIGURABLE MIXED-SIGNAL VLSI IMPLEMENTATION OF DISTRIBUTED ARITHMETIC

(75) Inventors: Erhan Ozalevli, Atlanta, GA (US); Paul Hasler, Atlanta, GA (US); David Verl Anderson, Alpharetta, GA (US); Walter Geeshan Huang, Greer, SC (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 11/465,192

(22) Filed: Aug. 17, 2006

(65) Prior Publication Data

US 2007/0040712 A1 Feb. 22, 2007

Related U.S. Application Data

(63) Continuation-in-part of application No. 11/381,068, filed on May 1, 2006, now Pat. No. 7,280,063.

(60) Provisional application No. 60/709,138, filed on Aug. 17, 2005.

(51) Int. Cl.
*H03M 1/66* (2006.01)
(52) U.S. Cl. ...................... 341/144; 341/149
(58) Field of Classification Search ......... 341/118–170
See application file for complete search history.

(56) References Cited

U.S. PATENT DOCUMENTS

| | | | |
|---|---|---|---|
| 4,989,179 A | 1/1991 | Simko | |
| 5,235,273 A | 8/1993 | Akar et al. | |
| 5,349,351 A | 9/1994 | Obara et al. | |
| 5,623,279 A | 4/1997 | Itakura et al. | |
| 5,682,175 A | 10/1997 | Kitamura | |
| 6,094,153 A | 7/2000 | Rumsey et al. | |
| 6,483,448 B2 | 11/2002 | Martin et al. | |
| 6,744,317 B2 * | 6/2004 | Kim et al. | 330/151 |
| 6,958,947 B2 * | 10/2005 | Park et al. | 365/228 |

OTHER PUBLICATIONS

International Search Report for corresponding PCT Patent Application No. PCT/US2006/032194 dated Apr. 20, 2007.

* cited by examiner

*Primary Examiner*—Lam T. Mai
(74) *Attorney, Agent, or Firm*—James E. Schutz, Esq.; Seyed Kaveh E. Rashidi-Yazd, Esq.; Troutman Sanders LLP

(57) ABSTRACT

Disclosed herein is a reconfigurable mixed signal distributed arithmetic system including: an array of tunable voltage references operable for receiving a delayed digital input signal; a combination device in electrical communication with the array of tunable floating-gate voltage references that selectively combines an output of the array of tunable voltage references into an analog output signal; and a feedback element in electrical communication with the combination device, wherein the array of tunable voltages and the delayed digital input signal combine to perform a distributed arithmetic function and the reconfigurable mixed signal distributed arithmetic system responsively generates the analog output signal.

18 Claims, 8 Drawing Sheets

RECONFIGURABLE MIXED-SIGNAL VLSI IMPLEMENTATION OF DISTRIBUTED ARITHMETIC

This applications claims priority of U.S. Provisional Patent Application No. 60/709,138 filed Aug. 17, 2005 and is a continuation in-part of U.S. application Ser. No. 11/381,068 filed May 1, 2006 now U.S. Pat. No. 7,280,063, the entire contents and substance of which are hereby incorporated by reference.

BACKGROUND

1. Field of the Invention

The present invention relates generally to mixed signal distributed arithmetic, and more specifically to a reconfigurable mixed-signal very-large-scale integration (VLSI) implementation of distributed arithmetic.

2. Description of Related Art

The battery lifetime of portable electronics has become a major design concern as greater functionality is incorporated into portable electronic devices. The shrinking power budget of modern portable devices requires the use of low-power circuits for signal processing applications. These devices include, but are not limited to, flash memory and hard disk based audio players. The data, or media, in these devices is generally stored in a digital format but the output is still synthesized as an analog signal. The signal processing functions employed in such devices may include finite impulse response (FIR) filters, discrete cosine transforms (DCTs), and discrete Fourier transforms (DFTs), which have traditionally been performed using digital signal processing (DSP). DSP implementations typically make use of multiply-and-accumulate (MAC) units for the calculation of these operations, and as a result the computation time increases linearly as the length of the input vector grows.

In many other applications, the input data is analog not digital while the output remains analog. Often, the processing for these applications do not require digital signal processing components therefore do not require the analog input to be converted into a digital signal. If such a conversion did occur, then this would use unnecessary power. Or, the processing for these applications occurred at a point where a digital-to-analog signal processing component would not be appropriate. For such applications, an analog-to-analog signal processing component would be preferred. Examples of these applications include but are not limited to signal processing for sensor networks, wireless communications, audio systems, hearing aids, and video systems.

Distributed arithmetic (DA) is an efficient way to compute an inner product, which is a common feature of the FIR filter, DCT, and DFT functions. DA computes an inner product in a fixed number of cycles, which is determined by the precision of the input data. In a traditional DA implementation, the inner product operation, $$y[n] = \sum_{i=0}^{K-1} w_i x[n-i] \quad (1)$$

is done as follows. Let the input signal samples be represented as B-bit 2's complement binary numbers, $$x[n-i] = -b_{i0} + \sum_{l=1}^{B-1} b_{il} 2^{-l}, \quad (2)$$

$$i = 0, \ldots, K-1,$$

where $b_{il}$ is the $l^{th}$ bit in the 2's complement representation of $x[n-i]$. Substituting equation (2) into equation (1) and swapping the order of the summations yields $$y[n] = -\left[\sum_{i=0}^{K-1} b_{i0} w_i\right] + \sum_{l=1}^{B-1} \left[\sum_{i=0}^{K-1} b_{il} w_i\right] 2^{-l}. \quad (3)$$

For a given set of $w_i$ ($i=0, \ldots, K-1$), the terms in the square braces may take only one of $2^K$ possible values which are stored in a lookup table (LUT). The DA computation is then an implementation of equation (3). Another way to interpret equation (1) is to represent the coefficients as B-bit 2's complement binary numbers, $$w_i = -b_{i0} + \sum_{l=1}^{B-1} b_{il} 2^{-l}, \quad (4)$$

$$i = 0, \ldots, K-1,$$

where $b_{il}$ is the $l^{th}$ bit in the 2's complement representation of $w_i$. Substituting equation (4) into equation (1) and swapping the order of the summations yields $$y[n] = -\left[\sum_{i=0}^{K-1} b_{i0} x[n-i]\right] + \sum_{l=1}^{B-1} \left[\sum_{i=0}^{K-1} b_{il} x[n-i]\right] 2^{-l}. \quad (5)$$

Now the LUT contains all possible combination sums of the input signal samples $\{x[n], x[n-1], \ldots, x[n-K+1]\}$.

DA is computationally more efficient than MAC-based approach when the input vector length is large. However, the trade-off for the computational efficiency is the increased power consumption and area usage due to the use of a large memory. What is needed therefore is a mixed signal circuit implementation for optimized DA performance, power consumption, and area usage.

BRIEF SUMMARY

Disclosed herein is a reconfigurable mixed signal distributed arithmetic system including: an array of tunable voltage references operable for receiving a delayed digital input signal; a combination device in electrical communication with the array of tunable floating-gate voltage references that selectively combines an output of the array of tunable voltage references into an analog output signal; and a feedback element in electrical communication with the combination device, wherein the array of tunable voltages and the delayed digital input signal combine to perform a distributed arithmetic function and the reconfigurable mixed signal distributed arithmetic system responsively generates the analog output signal.

Also disclosed herein is a method for performing mixed signal distributed arithmetic including: receiving an analog input signal; storing the analog input signal in a plurality of storage elements; selectively combining the delayed/stored analog input signal; and responsively generating an analog output signal, wherein selectively combining the delayed analog input signal is performed with a plurality of digital circuit elements.

Further disclosed herein is a method for performing mixed signal distributed arithmetic including: receiving a digital input signal; storing the digital input signal in a shift register; combining the digital input signal from the shift register with an array of tunable voltage references; and responsively generating an analog output signal.

Also, disclosed herein is a reconfigurable mixed signal distributed arithmetic system including: a plurality of storage elements operable for receiving a sampled analog input signal; a combination device in electrical communication with the plurality of storage elements that selectively combines an output of the plurality of storage elements into an analog output signal; and a feedback element in electrical communication with the combination device, wherein the combination device uses a plurality of digital circuits elements to selectively combine the output of the plurality of storage elements and wherein the plurality of storage elements and the plurality of digital circuits combine to perform a distributed arithmetic function and the reconfigurable mixed signal distributed arithmetic system responsively generates the analog output signal.

These and other objects, features and advantages of the present invention will become more apparent upon reading the following specification in conjunction with the accompanying drawing figures.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION

Figure 1A:
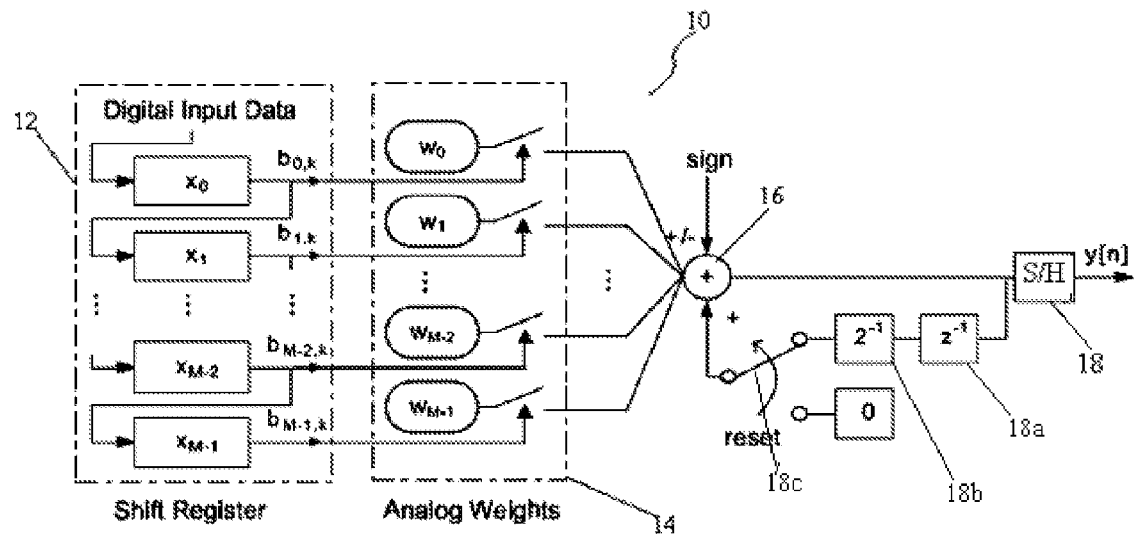
FIGS. 1A-C are block and timing diagrams that illustrate mixed-signal DA systems in accordance with exemplary embodiments of the invention.

Disclosed herein is a mixed-signal DA system built utilizing the analog storage capabilities of floating-gate (FG) transistors for reconfigurability and programmability. Referring now to FIG. 1A, a block diagram of a mixed-signal DA system 10 in accordance with exemplary embodiments is illustrated. The mixed signal system includes a shift register 12 for receiving and delaying a digital input signal, an array of tunable voltage references, or analog weights, 14, a combination device 16 for combining the weighted signals and generating an analog output signal, and a storage element 18. In exemplary embodiments, a delay element 18a, a scaling unit 18b, and a switch 18c is used in a feedback path of the mixed-signal DA system 10 for the DA computation. The switch 18c may be used to select between zero and the feedback path.

Figure 1B:
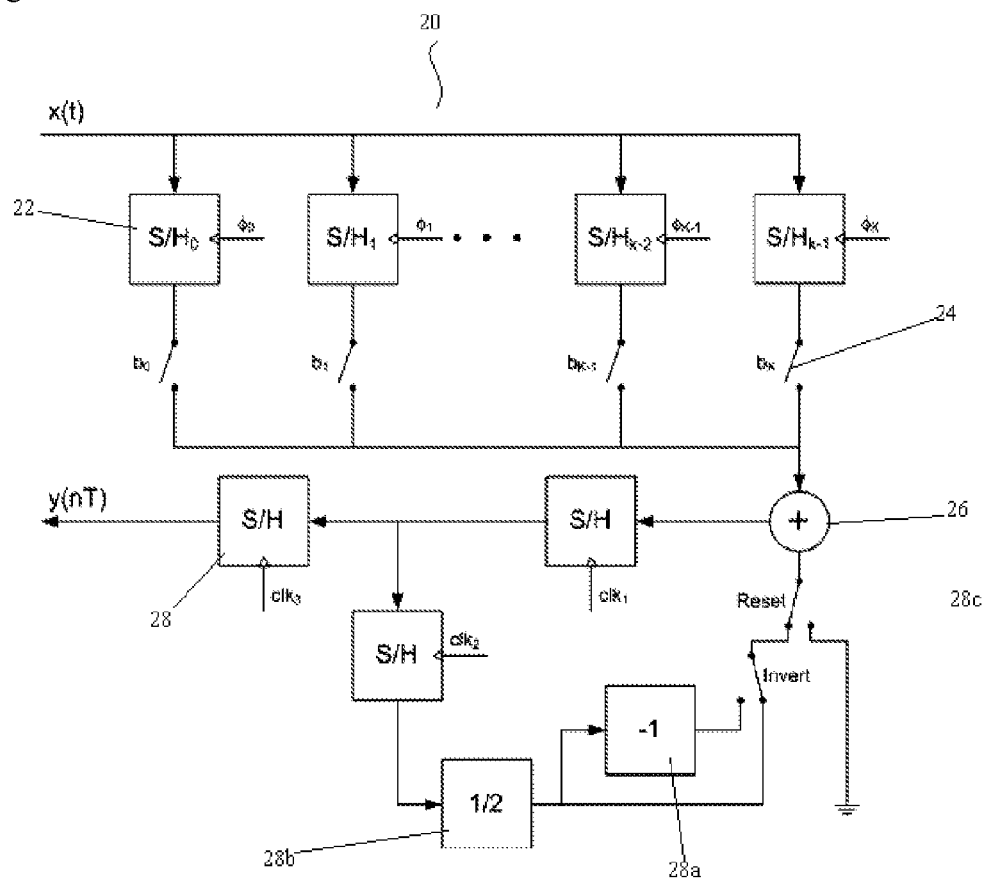

Turning now to FIG. 1B, a block diagram of another mixed-signal DA system 20 in accordance with exemplary embodiments is illustrated. The mixed signal system 20 includes a plurality of storage elements 22 for receiving, delaying, and optionally weighting an analog input signal. The mixed signal system 20 also includes a plurality of digital circuit elements 24 for selecting one or more desired stored input signals from at least a portion of the plurality of storage elements 22 and transmitting the desired stored input signals to a combination device 26. The mixed signal system 20 includes a sample-and-hold element 28 that samples and stores an output of the combination device 26. In exemplary embodiments, an inverter 28a, a scaling unit 28b, and a switch 28c is used in a feedback path of the mixed-signal DA system 20 for the DA computation.

Continuing with reference to FIG. 1B, in one embodiment there are K+1 sample-and-holds circuits such that when the sample-and-hold circuit that is sampling the analog input, x(t), the other sample-and-hold circuits can be used for computing the output. If an additional sample-and-hold circuit did not exist, then the computation would have to wait for the sampling operation to complete before beginning. In each of the sample-and-hold circuits, a time delayed version of the input is stored. This delay ranges from zero to nT where n is the bit precision of the coefficients and T is the amount of time needed to compute the output. Rather than using a cascade of analog storage elements where each element represents how long the input has been delayed relative to x(t) and each element is fixed to a certain coefficient, this architecture views each storage element as an absolute time when the input was captured and generates the relative time delay by moving the coefficient to the appropriate storage element as time elapses.

Figure 1C:
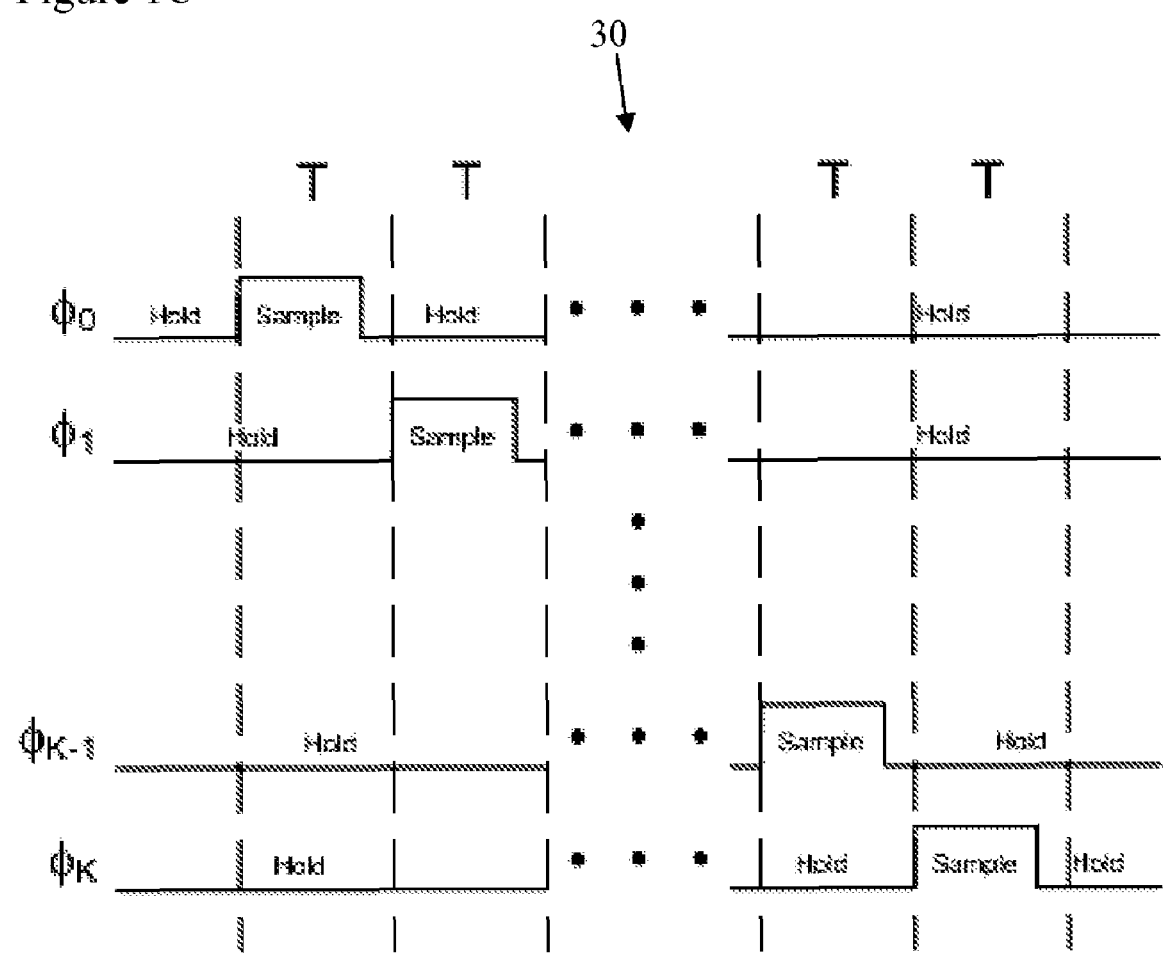

FIG. 1C illustrates a timing diagram 30 corresponding to the mixed-signal DA system 20 depicted in FIG. 1B. The coefficient vector is stored digitally so to create the time delay means just storing the coefficients in a single shift register whose size is equal to n(K+1) where n is the bit precision of the coefficients and K is the number of elements in the coefficient vector. A single bit is shifted in the shift register every T/n interval to compute the DA computation and to insure that the coefficient element is shifted into the next register in T time. Having one of the registers at time t is zero insures that the sample-and-hold circuit that is sampling is not used in the computation. Only K of the sample-and-hold circuits are used for computing the output and which sample-and-hold circuits are used and when in the computation are determined by the coefficient vector and the current iteration of the computation. There are n iterations in one cycle of the computation.

The compact size of the mixed-signal DA systems 10 and 20 is obtained through the iterative nature of the DA computational framework, where many multipliers and adders are replaced with an addition stage, a single gain multiplication, and a coefficient array. The low-power implementations of these filters can readily ease the power consumption requirements of portable devices. Also, due to the serial nature of the DA computation, the power and area of this filter increase linearly with its order. Hence, the mixed-signal DA systems 10 and 20 allow for a compact and low power implementation of high-order FIR filters, DCT, and DFT functions.

Figure 2:
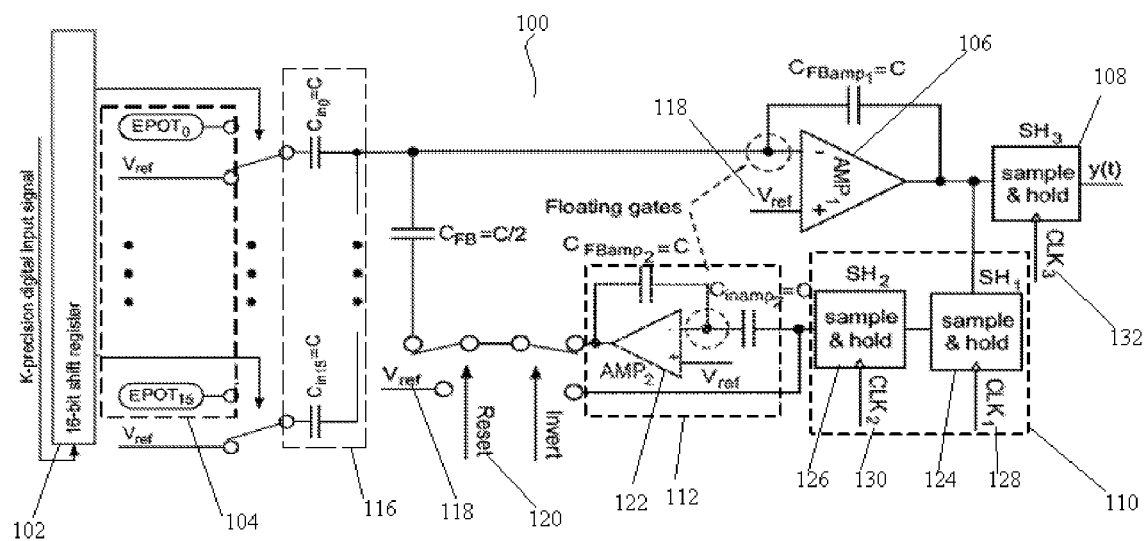
FIG. 2 is a circuit diagram illustration of a mixed-signal DA system in accordance with exemplary embodiments of the invention.

Referring now to FIG. 2, a circuit diagram of an exemplary embodiment of yet another mixed-signal DA system 100 is illustrated. The mixed-signal DA system 100 includes of four base components, a shift register 102, an array of tunable FG voltage references (epots) 104, inverting amplifiers (AMP) 106, and sample-and-hold (SH) circuits 108. Digital inputs are introduced to the mixed-signal DA system 100 by using the shift register 102. These digital input words represent the digital bits, $b_{ij}$ in equation (2), which selects the epot 104 voltages to form the appropriate sum of weights necessary for the DA computation at the $j^{th}$ bit. The clock frequency of the shift register 102 is dependent on the input data precision, K, and the length of the filter, M, and is equal to M ° K times the sampling frequency. Once the $j^{th}$ input word is serially loaded into the top shift register, the data from this register is latched at K times the sampling frequency. Alternatively, M shift registers could be used feed digital input data into and reduce the clock to K times the sampling frequency. A clock that is K times faster than the sampling frequency would preferably be used for this ideal configuration.

In one embodiment, where the amount of area used by the shift registers is not a design concern, an M-tap FIR filter could have M shift registers. The analog weights of DA are stored by the epots 104. For a more thorough discussion of the configurations and operation of the epot 104 see U.S. patent application Ser. No. 11/381,068 "Programmable Voltage-Output Floating-Gate Digital to Analog Converter and Tunable Resistors." When selected, these weights are added by employing a charge amplifier structure 116 composed of same size capacitors, and a two-stage amplifier 106, $AMP_1$. The epot 104 voltages as well as the rest of the analog voltages in the system may be referenced to a reference voltage 118, $V_{ref}$=2.5V. Since the addition operation is performed by using an inverting $$\sum_{i=0}^{m-1} w_i b_{i(K-1)}$$

amplifier, the relative output voltage, when Reset 120 signal is enabled, becomes equal to the negative sum of the selected weights for $C_{ini}=C_{FBamp1}$. For the first computational cycle, the result of the addition stage represents the summation which is the addition of weights for the LSBs of the digital input data.

A delay element 110, an inverter 112, and a divide-by-two element 114 may be used in the feedback path of the mixed-signal DA system 100 for the DA computation. In one embodiment, sample-and-hold circuits, $SH_1$ 124 and $SH_2$ 126, and inverting amplifiers, $AMP_1$ 106 and $AMP_2$ 122, are employed in the feedback path. The $SH_1$ 124 and $SH_2$ 126 circuits store the amplifier output to feed it back to the mixed-signal DA system 100 for the next cycle of the computation. Non-overlapping clocks, $CLK_1$ 128 and $CLK_2$ 130, are used to hold the analog voltage while the next stream of digital data is introduced to the addition stage. In one embodiment, these clocks have a frequency of K times the sampling frequency. The stored data is then inverted relative to the reference voltage, $V_{ref}$ 118, by using the second inverting amplifier, $AMP_2$ 122, to obtain the same sign as the summed epot voltages. Ideally, $AMP_2$ 122 is identical to $AMP_1$ 106 and has the same size input/feedback capacitors. After obtaining the delay and the sign correction, the stored analog data is fed back to the addition stage as delayed analog data. During the addition, it is also divided by two by using $C_{FB}=C_{FBamp1}/2=C/2$, which gives a gain of 0.5 when it is added to the new sum. This operation is repeated until the MSBs of the digital input data is loaded into the shift register 102. The MSBs correspond to $(K-1)^{th}$ bits, and are used to make the computation 2's-complement compatible. This compatibility is achieved by disabling the inverting amplifier in the feedback path during the last cycle of the computation by enabling the Invert signal. As a result, during the last cycle of the computation, the relative output voltage of $AMP_1$ 106 becomes $$V_{out_{amp1}} - V_{ref} = -\sum_{i=0}^{M-1} \frac{C_{in_i}}{C_{FBamp_1}} (V_{ref} - V_{epot_i}) b_{i0} + \sum_{j=1}^{K-1} 2^{-j} \sum_{i=0}^{M-1} \frac{C_{in_i}}{C_{FBamp_1}} (V_{ref} - V_{epot_i}) b_{ij}. \quad (6)$$

Finally, when the computation of the output voltage in equation (6) is finished, it is sampled by $SH_3$ 108 using $CLK_3$ 132, which is enabled once every K cycle. $SH_3$ 108 holds the computed voltage till the next analog output voltage is ready. The new computation starts by enabling the Reset 120 signal to zero out the effect of the previous computation. Then, the same processing steps are repeated for the next digital input data.

Figure 3:
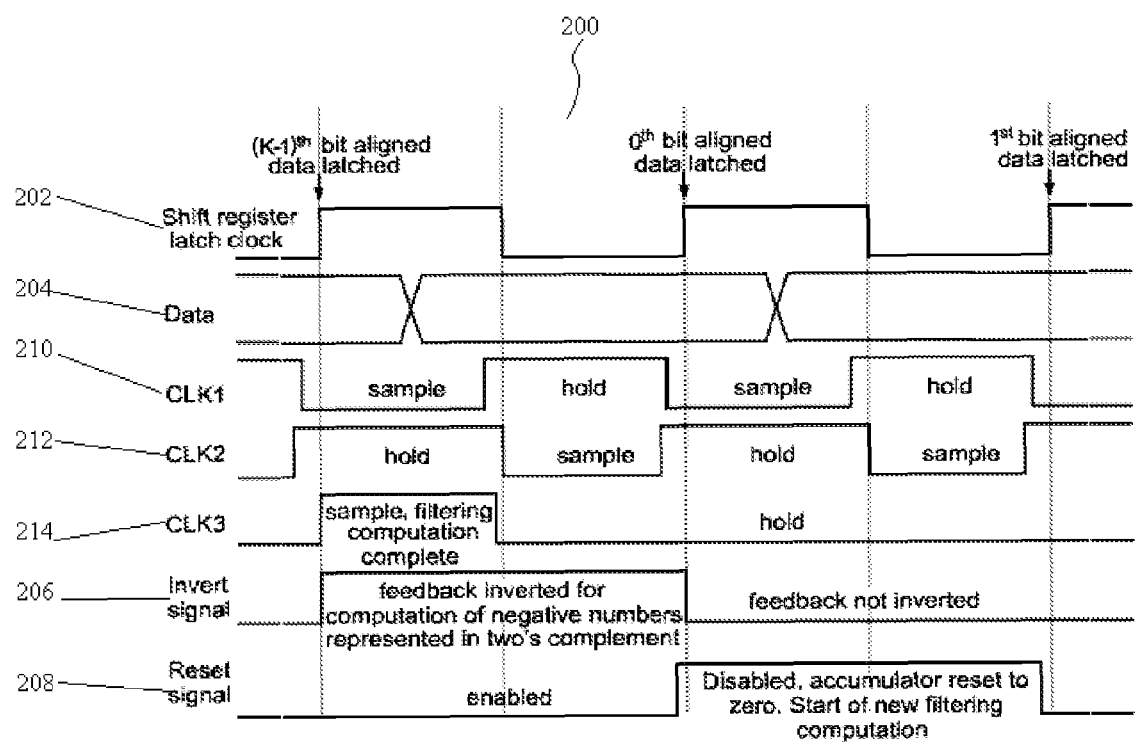
FIG. 3 is a digital clock diagram corresponding to the DA system depicted in FIG. 2.

Continuing with reference to FIG. 3, a timing diagram 200 for the mixed-signal DA system 100 including, a shift register latch clock signal 202, a data signal 204, an Invert signal 206, a Reset signal 208, and various clock signals, CLK1 210, CLK2 212, and CLK3 214, is illustrated. The timing of the digital data and control bits governs the DA computation.

To achieve an accurate computation using DA, the circuit components are designed to minimize the gain and offset errors in the signal path. In an exemplary embodiment of the mixed-signal DA system 100 illustrated in FIG. 2, epots 104, inverting amplifiers 106 and 122, and sample-and holds 108, 124, and 126 are utilized. In this embodiment, an array of epots 104 is used for storing the filter weights and during the programming, individual epots 104 are controlled and read by a decoder. In one embodiment, the epots 104 and inverting amplifiers 106 and 122 use FG transistors to exploit their analog storage and capacitive coupling properties. A precise tuning of the stored voltage on FG node may be achieved by utilizing the hot-electron injection and the Fowler-Nordheim tunneling mechanisms. Exemplary methods for programming FG transistors are disclosed in U.S. patent application Ser. No. 11/382,640 entitled "Systems and Methods for Programming Floating-Gate Transistors" the entire contents and substance of which is hereby incorporated by reference and in U.S. patent application Ser. No. 11/381,068 entitled "Programmable Voltage-Output Floating-Gate Digital to Analog Converter and Tunable Resistors". The epots 104 employ FG transistors to store the analog coefficients of the inner product. In contrast, the inverting amplifiers 106 and 122 use FG transistors not only to obtain capacitive coupling at their inverting-node, but also to remove the offset at the FG terminals.

Figure 4:
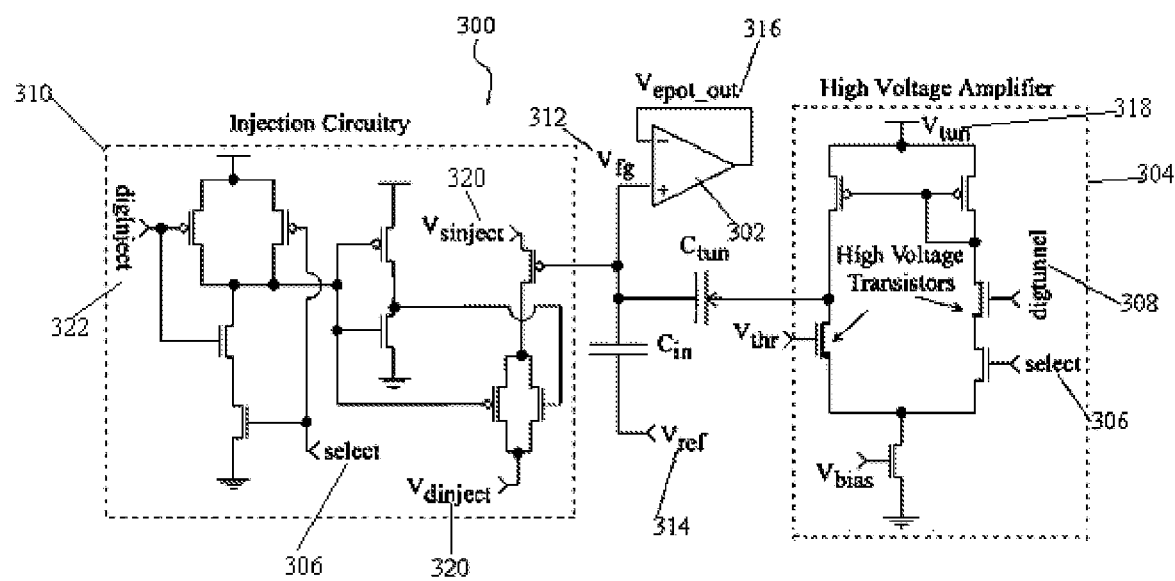
FIG. 4 is a circuit diagram that illustrates a modified epot in accordance with an exemplary embodiment of the invention.

Turning now to FIG. 4, an exemplary embodiment of an epot circuit 300 is illustrated. The epot circuit 300 may be modified from its original version to obtain a low-noise voltage reference. The epot circuit 300 is a dynamically reprogrammable, on-chip voltage reference that uses a low-noise amplifier integrated with FG transistors and programming circuitry 304 to tune the stored analog voltage. The amplifier 302 in the epot circuit 300 may be used to buffer the stored analog voltage so that the epot circuit 300 can achieve low noise and low output resistance as well as the desired output voltage range.

The epots 300 may be incorporated into the design not only to store the weights of DA, but also to obtain reconfigurability/tunability. An exemplary embodiment of a programming circuitry 304 for the epot is shown in FIG. 4. The stored voltage is tuned by the using Fowler-Nordheim tunneling and the hot-electron injection mechanisms. The tunneling is utilized for coarse programming of the epot voltage 316, and used to reach 200 mV below the target voltage. The purpose of undershooting is to avoid the coupling effect of the tunneling junction on the floating gate when tunneling is turned off. The tunneling mechanism decreases the number of electrons, thus increasing the epot voltage 316. After selecting the desired epot 300 by enabling its Select signal 306, a tunneling bit 308, digtunnel, is activated and a high voltage across the tunneling junction is created. During programming in accordance with an exemplary embodiment, the high voltage amplifier is powered with 14V.

In contrast to the coarse programming, the precise programming is achieved by using the hot-electron injection. The desired epot 300 is selected by enabling its Select signal 306 and an injection bit 322, diginject. A hot-electron injection mechanism 310 decreases the epot voltage 316 by increasing the number of electrons on the FG terminal. In accordance with an exemplary embodiment, hot electron injection may be performed by pulsing a 6.5V signal across the drain and the source terminals of a pFET. As the FG voltage 312, $V_{fg}$, decreases, the injection efficiency drops exponentially since the injection transistor has better injection efficiency for smaller source-to-gate voltages. By keeping the FG potential at a constant voltage, the number of injected electrons and hence the output voltage change, is accurately controlled. To keep the FG at a constant potential, the input voltage of the epot 300, $V_{ref}$ 314, is modulated during programming based on the epot voltage 316, since the epot voltage 316 is approximately at the same potential as $V_{fg}$ 312. After programming, the tunneling voltage $V_{tun}$ 318 and injection voltage 320 are preferably set to ground to decrease power consumption, and minimize the coupling to the floating-gate terminal. Also, $V_{ref}$ 314 is set to 2.5V to have the same reference voltage for all parts of the system. The epot voltage 316 is programmed with respect to this voltage reference with an error less than 1 mV for a 4V output range. The amount of charge that needs to be stored at an epot 300 depends on the targeted weight and the gain error introduced by the input/feedback capacitors at the addition stage. During programming, the Reset signal is enabled and all other capacitor inputs are connected to $V_{ref}$ 314 while periodically switching the targeted epot 300 to find the voltage difference when epot 300 is selected and unselected. This voltage may be used to find the approximate value of the stored weight.

One advantage of exploiting FG transistors in the mixed-signal DA system is that the area allocated for the capacitors may be dramatically reduced. This structure helps to overcome the area overhead, which is mainly due to layout techniques used to minimize the mismatches between the input and feedback capacitors. In one embodiment, the unit capacitor, C, is set to 300 fF, and no layout technique is employed. As expected, due to inevitable mismatches between the capacitors, there will be a gain error contributed from each input capacitor. The stored weights are also used to compensate this mismatch. When the analog weights are stored to the epots, the gain errors are also taken into account to achieve accurate DA computation. Additional explanation of the size reduction realized using FG transistors may be found in U.S. patent application Ser. No. 11/381,068 "Programmable Voltage-Output Floating-Gate Digital to Analog Converter and Tunable Resistors."

Figure 5A:
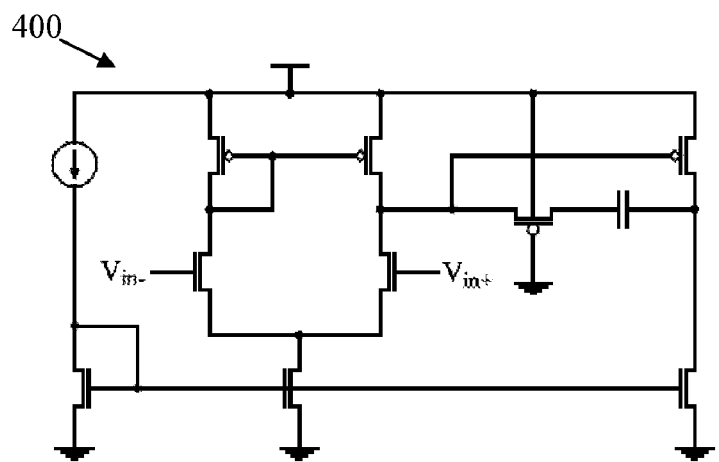
FIGS. 5A-E are circuit diagrams that illustrate various components of the mixed-signal FIR filter depicted in FIG. 2.

Unlike switched-capacitor amplifiers, the addition in the mixed-signal DA system is achieved without resetting the inverting node of the amplifiers because the floating-gate inverting-node of the amplifiers allow for the continuous time operation. Turning now to FIG. 5a, an exemplary embodiment of an inverting amplifier 400 is illustrated. The inverting amplifier 400 may be implemented by using a two-stage amplifier structure to obtain a high gain and a large output swing. Similar to the epots, the charge on the FG node of these amplifiers is precisely programmed by monitoring the amplifier output while the system operates in the reset mode. In the reset mode, the shift registers are cleared and the Reset signal is enabled. Therefore, all the input voltages to the input capacitors including the voltage to the feedback capacitor, $C_{FB}$, are set to the reference voltage. These conditions ensure that the amplifier output becomes equal to the reference voltage when the charge on the FG is compensated. The charge on the FG terminal may be tuned using the hot-electron injection and the Fowler-Nordheim tunneling mechanisms. By using this technique, the offset at the amplifier output may be reduced to less than 1 mV.

Figure 5B:
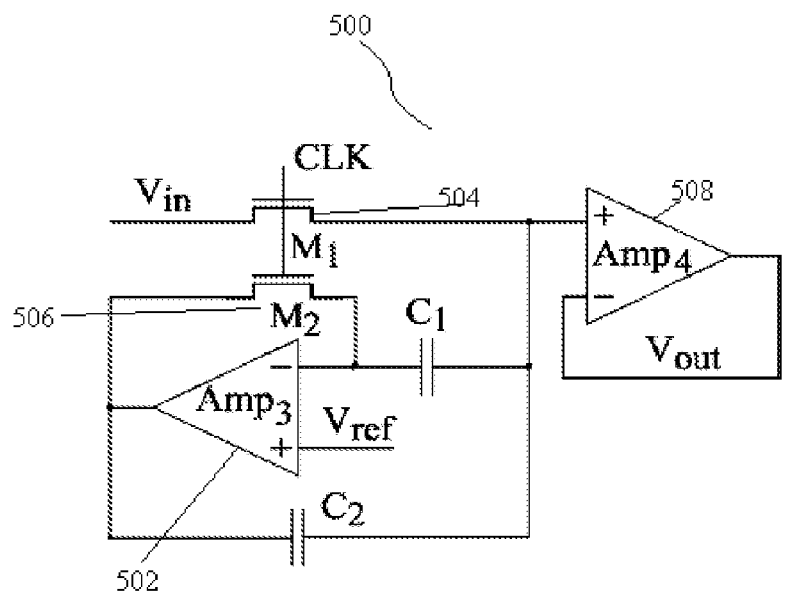
Figure 5C:
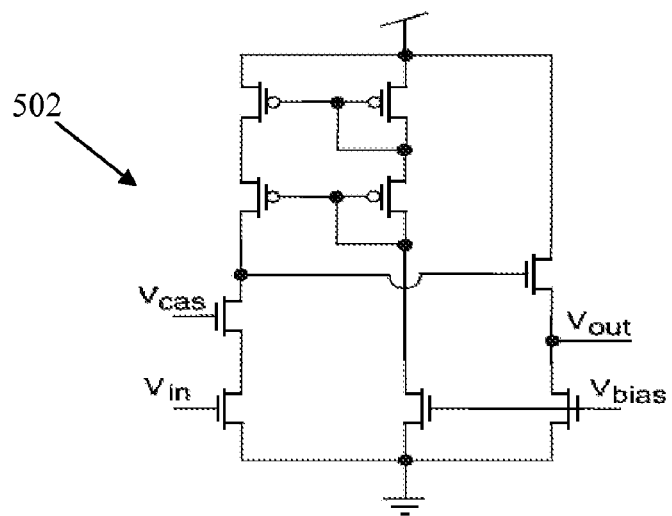

Referring now to FIG. 5b, an exemplary embodiment of a SH circuit 500 that achieves high sampling speed and high sampling precision is illustrated. The SH circuit 500 may be implemented by utilizing the sample-and-hold technique using Miller hold capacitance. The SH circuit 500 reduces the signal dependent error, while maintaining the sampling speed and precision by using the Miller capacitance technique together with amplifier Amp3 502 shown in more detain in FIG. 5c. For simplification, assume there is no coupling between $M_1$ 504 and $M_2$ 506, and amplifier, Amp3 502, has a large gain, then the pedestal error contributed from turning switches ($M_1$ 504 and $M_2$ 506) off can be written as $$\Delta V_{S1} + \Delta V_{S2} = \frac{\Delta Q_1 (C_2 + C_{2B})}{C_{2B}(C_1 + C_2) + C_1 C_2 (A+1)} + \frac{\Delta Q_2}{C_2} \quad (7)$$

where $\Delta Q_1$ and $\Delta Q_2$ are the charges injected by $M_1$ 504 and $M_2$ 506, respectively. Also, A and $C_{2B}$ are the gain and input capacitance of the amplifier, Amp3 502. $\Delta Q_2$ is independent of the input level, therefore $\Delta V_{S2}$ may be treated as an offset. In addition, the error contributed by $M_1$ 504, $\Delta V_{S1}$, may be minimized using the Miller feedback, and this error decreases as A increases. Due to the serial nature of the DA computation offset, the feedback path may be attenuated as the precision of the digital input data increases. Therefore, Amp3 502 is preferably designed to minimize the signal dependent error, $\Delta V_{S1}$.

Figure 5D:
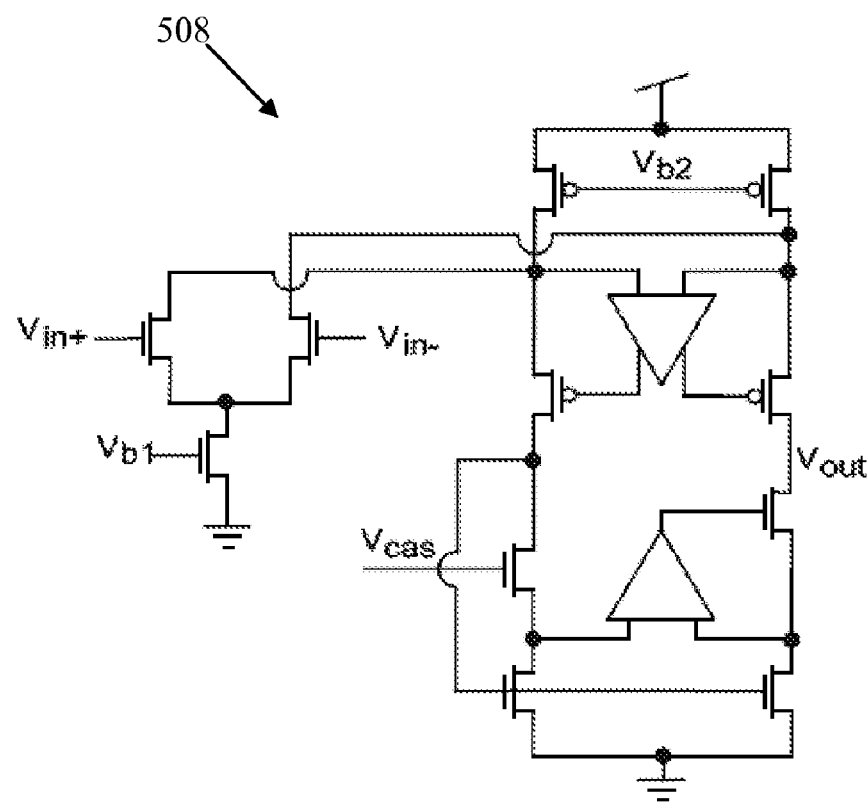
Figure 5E:
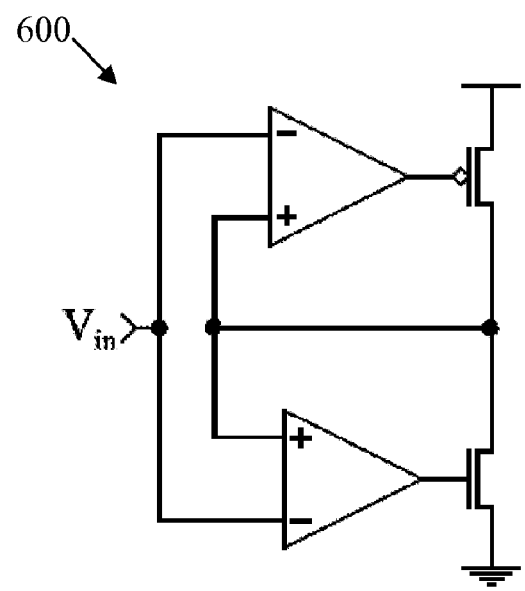

In another exemplary embodiment, a gain-boosting technique may be incorporated into the SH amplifier, Amp4 508, as shown in more detail in FIG. 5d, to achieve a high gain and fast settling. Two SH circuits, $SH_1$ and $SH_2$ are used in the feedback path to obtain the fixed delay for the sampled analog voltage. In addition, the third SH circuit, $SH_3$, 108 is utilized to sample and hold the final computed output once every K cycles. $SH_3$ 108 uses a negative-feedback output stage 600, shown in FIG. 5e, to be able to buffer the output voltage off-chip. Due to the performance requirements of the system, these SH circuits may typically consume more power than the rest of the system.

DA is typically implemented in digital circuits, therefore an analysis of the error sources generated by the analog components should be considered. These error sources include gain and offset errors, non-ideal weights, and noise in the signal path. The effect of non-ideal weights mostly depends on the application that DA is used for.

Continuing with reference to FIG. 2, as in serial digital-to-analog converters, the gain and offset errors determine the accuracy of DA computation. If the error at the addition stage due to the weight errors in the epots and the mismatch errors between the input capacitors, $C_{ini}$ (for i=1, 2, ...), is assumed to be negligible, then the gain/offset errors and the noise in the data paths become the main sources of error. In the mixed-signal DA system, the inverting amplifiers, $AMP_1$ 106 and $AMP_2$ 122, may introduce gain and offset errors, and the sample-and hold circuits, $SH_1$ 124 and $SH_2$ 126 may cause offset errors. In addition, the mismatch between $C_{FB}$ and $C_{FBamp1}$ as well as between $C_{FBamp2}$ and $C_{inamp2}$ may cause gain errors.

Unlike in the digital domain where a division by two is simply a shift of a bit, in the analog domain this operation is achieved by employing an analog circuit. This circuit implementation often introduces an error and the result of the division becomes 0.5 plus a gain error, $\Delta$. The following error calculations and explanations are provided to enhance understanding of the theories underlying the present disclosure. They are not intended to limit the scope of the present invention. The effect of $\Delta$ on the output of a DA computation, y[n], is modeled by $$y[n] = -\sum_{i=0}^{M-1} w_i b_{i0} + \sum_{j=1}^{K-1} (0.5+\Delta)^j \sum_{i=0}^{M-1} w_i b_{ij} \quad (8)$$

The output error caused by $\Delta$ can be found by computing the difference of equations (5) and (8). For simplification, $$\sum_{i=0}^{M-1} w_i b_{ij}$$

the term is set to $\alpha$. Therefore, the output error, $\epsilon$, reduces to the difference of two geometric sums and can be expressed as $$\varepsilon = \alpha \frac{1-(0.5+\Delta)^K}{1-(0.5+\Delta)} - \alpha \frac{1-0.5^K}{1-0.5} = \alpha \frac{1-(0.5+\Delta)^K}{0.5-\Delta} - \alpha \frac{1-0.5^K}{0.5} \quad (9)$$

Figure 6A:
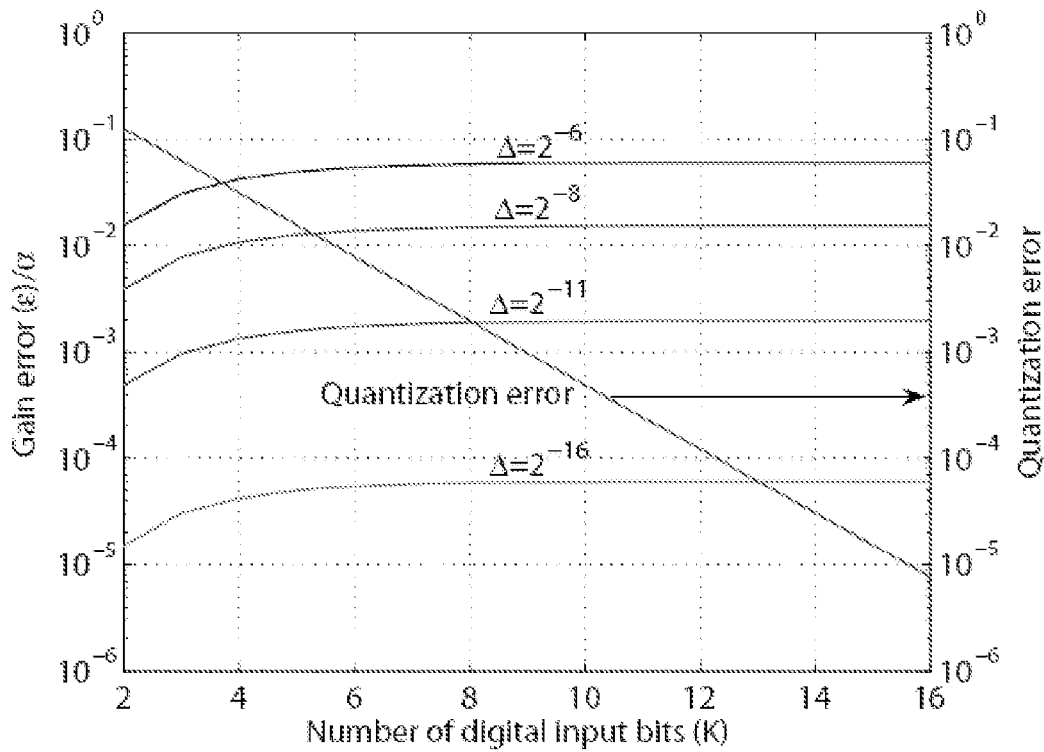
FIGS. 6A-B are graphs that illustrate the computational error of the mixed-signal DA system and the frequency response of the variance for symmetric offset error.

A plot of the output error due to the gain error normalized by $\alpha$ for varying values of $\Delta$ and K is illustrated in FIG. 6a. Since this system converts the digital input data to an analog output, the output error due to quantization is also provided. The intersection of output error and quantization error curves provides the minimum achievable output error of the proposed system and determines the precision of an equivalent digital system. For example, when $\Delta=2^{-11}$, the two curves intersect at $\epsilon=\alpha=0.002$ and K=8. This intersection point represents the minimum error when $\Delta=2^{-11}$ and that proposed system is equivalent to using an 8-bit digital DA. As K becomes large, $\epsilon$ approaches a limit which is equal to $2\Delta/(\Delta-0.5)$. Another source of error is the offset error. It is modeled as a constant error, $\delta$, added to each $j^{th}$ summation of weights, $$\sum_{i=0}^{M-1} w_i b_{ij}$$

as follows $$y[n] = -\left[\delta + \sum_{i=0}^{M-1} w_i b_{i0}\right] + \sum_{j=1}^{K-1} 2^{-j}\left[\delta + \sum_{i=0}^{M-1} w_i b_{ij}\right]. \quad (10)$$

After distributing $\Sigma_{j=1}^{K-1} 2^{-j}$ and then grouping the $\delta$ into one term, the error due to offset can be written as the summation of a geometric series.

$$error_{offset} = \delta \frac{1-0.5^K}{1-0.5} - 2\delta = \delta \cdot 2^{-(K-1)} \quad (11)$$

As I increases, the offset error in the feedback loop decreases, which is a byproduct of how DA handles two's complement numbers. In DA, the last summation of weights, $$\sum_{i=0}^{M-1} w_i b_{i0},$$

is subtracted rather than added. This system decreases the offset error especially when the I is large. For K=8 and $\delta$=100 mV, the offset error becomes 0.7813 mV.

The random error is assumed to be Gaussian and is represented by $X_j$. The random variable $X_j$ is added to the summation of weights at each $j^{th}$ iteration, and all $X_j$'s are independent and identically distributed.

$$y[n] = -\left[X_0 + \sum_{i=0}^{M-1} w_i b_{i0}\right] + \sum_{j=1}^{K-1} 2^{-j}\left[X_j + \sum_{i=0}^{M-1} w_i b_{ij}\right] \quad (12)$$

Once the term $$\sum_{j=1}^{K-1} 2^{-j}$$

is distributed and the $X_{0j}$ terms are collected into one summation, the mean and variance of $y[n]$ can be written as $$\mu_Y = \mu_X \frac{1 - 0.5^K}{1 - 0.5} - 2\mu_X$$

and $$\sigma_Y^2 = \sigma_X^2 \frac{1 - 0.25^K}{1 - 0.25},$$

respectively. As K approaches infinity, the mean of the random error approaches zero and the maximum variance of the random error becomes $4/3\sigma^2$.

The errors due to non-ideal filter weights, such as random offset error, are caused by the limited precision of the epot programming and the epot noise. The effects of these errors are similar to the quantization effects in the digital domain which causes the linear difference equation of an FIR filter to become a nonlinear.

In determining, symmetric offset error, the frequency response for $e[n]$ can be written as $$E(w) = \sum_{n=0}^{M-1} e[n]e^{-jwn}.$$

Assuming the FIR filter is Type-2 and the offset errors are of the same symmetry as the filter, $E(w)$ can be rewritten as a summation of cosines.

$$E(w) = e^{-jw\frac{M-1}{2}} \sum_{n=0}^{\frac{M}{2}-1} 2e[n]\cos\left(w\left(\frac{2n+1}{2}\right)\right) \quad (13)$$

Figure 6B:
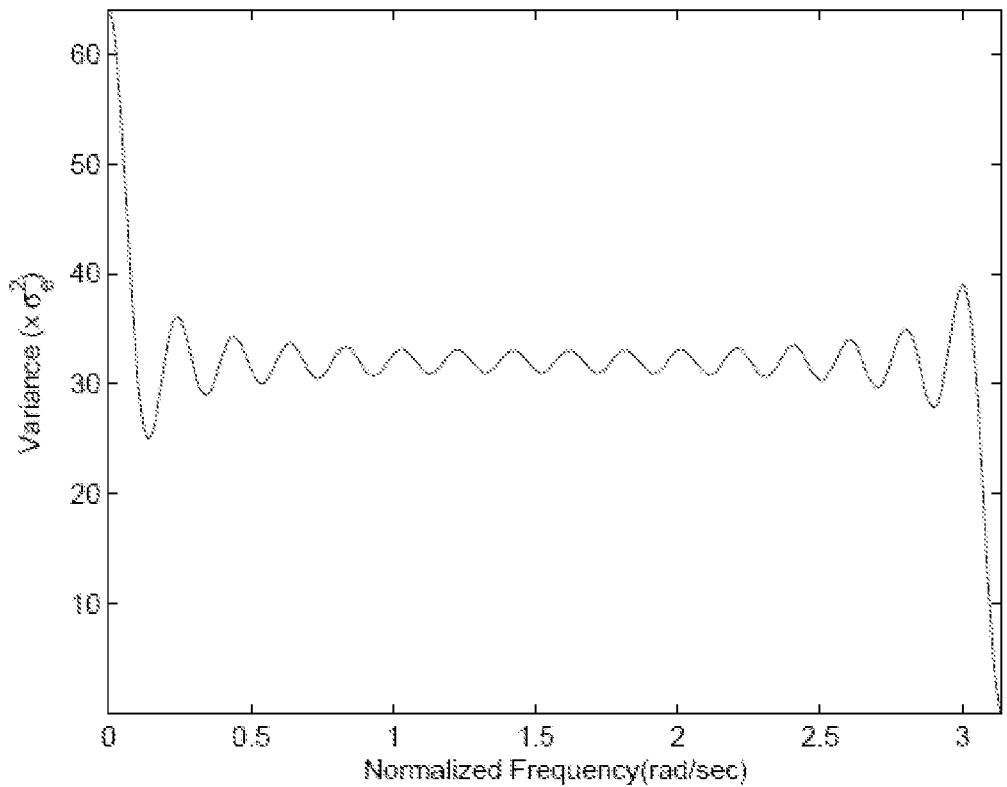

Treating $e[n]$ as a random variable with a variance of $\sigma_e^2$ and using some trigonometric identities and Euler's rule, the variance of $E(w)$ can be written as follows $$\sigma_E^2(w) = \sigma_e^2\left(M + \frac{\sin(wM)}{\sin(w)}\right) \quad (14)$$

where $\sigma_E^2(w)$ can vary from zero to $2M\sigma_e^2$. The frequency response of $\sigma_E^2(w)$ for M=32 is illustrated in FIG. 6b. The effects of the symmetrical offset errors are similar to the effects of coefficient quantization in symmetrical digital FIR filters. These effects are reduced pass-band width, increased pass-band ripple, increased transition-band, and reduced minimum stop-band attenuation.

In determining non-symmetric offset error, $E(w)$ should not be rewritten as a summation of cosines because the offset error is not symmetrical. Assuming $e[n]$ is a random variable with a variance of $\sigma_e^2$, the variance of $E(w)$, $\sigma_E^2$, is equal to $M\sigma_e^2$ for an M-tap FIR filter. Unlike the variance for symmetrical offset errors which varies with frequency, the variance for non-symmetric offset errors is constant.

The effects of time-varying random error on DA computation can be modeled as $$y[n] = -\sum_{i=0}^{M-1} (w_i + e_{i0})b_{i0} + \sum_{j=1}^{K-1} 2^{-j} \sum_{i=0}^{M-1} (w_i + e_{ij})b_{ij} \quad (15)$$

Assuming each $e_{ij}$ is a random variable that is independent and identically distributed, the error can be expressed as $$\text{error} = -\sum_{i=0}^{M-1} e_{i0}b_{i0} = \sum_{j=1}^{K-1} 2^{-j} \sum_{i=0}^{M-1} e_{ij}b_{ij} \quad (16)$$

Since the above equation is just a summation of random variables, the parameter of significance for this analysis is the maximum variance of the random error, $\sigma_{error}^2$. For simplification, the analysis assumed that $b_{ij}$ for all i and j is equal to 1. First, the variance of $$-\sum_{i=0}^{M-1} e_{i0}b_{i0}$$

is computed as $M\sigma^2$. Then, the variance of is $$\sum_{j=1}^{K-1} 2^{-j} \sum_{i=0}^{M-1} e_{ij}b_{ij}$$

calculated as $$M\sigma^2 \frac{1 - 0.5^K}{1 - 0.5}.$$

These two variances results in a total variance, $\sigma_{error}^2 = M\sigma^2(3 - 0.5^{K-1})$, which approaches $3M\sigma^2$ when K is large.

Switched-capacitor techniques are suitable for FIR filter implementations and offer precise control over the filter coefficients. To avoid the power and speed trade-off in the switched-capacitor FIR filter implementations, a transposed FIR filter structure is preferably employed. In addition, a rotating switch matrix may be used to eliminate the error accumulation. Alternatively, these problems can be partially alleviated by employing over sampling design techniques. The filter implementations with these techniques offer design flexibility by allowing for coefficient and/or input modulation. However, this design approach requires the use of higher clock rates to obtain high over-sampling ratios.

The programmability in analog FIR filter implementations can also be obtained by utilizing switched-current techniques. These techniques allow for the integration of the digital coefficients through the use of the current division technique or multiplying digital-to-analog converters (MDAC). Moreover, a circular buffer architecture can be utilized to ease the problems associated with analog delay stages and to avoid the propagation of both offset voltage and noise. The use of a switched-current FIR filter based on DA can also be used for pre-processing applications to decrease the hardware complexity and area requirements of the FIR filters. Some of these techniques may be employed for post processing by using them after a DAC. However, the use of a high-resolution and/or high-speed DAC in addition to the FIR filter implementation causes an increase in the area and power consumption. The disclosed DA structure which can be used for FIR filtering employs DA for signal processing and utilizes the analog storage capabilities of FG transistors to obtain programmable analog coefficients for re-configurability. The DAC is used as a part of the DA implementation, which helps in achieving digital-to-analog conversion and signal processing at the same time.

Compared to the switched-capacitor implementations, which have their coefficients set by using different capacitor ratios, the proposed implementation offers more design flexibility since its coefficients can be set by tuning the stored weights at the epots. Also, offset accumulation and signal attenuation make it difficult to implement long tapped delay lines with traditional approaches. In one embodiment, DA processing decreases the offset as the precision of the digital input data increases. Also, the gain error is mainly caused by the two inverting stages (implemented using $AMP_1$ and $AMP_2$), and may be minimized using special layout techniques only at these stages. The measurement results illustrated that the output signal of the filter follows the ideal response very closely because it is insensitive to the number of filter taps and most of the computation is performed in the feedback path. Also, the power and area of the proposed design increases linearly with the number of taps due to the serial nature of the DA computation. Therefore, the disclosed system is well suited for compact and low-power implementations of high-order filters for post-processing applications. The programmable analog coefficients of this filter will enable the implementation of adaptive systems that can be used in applications such as adaptive noise cancellation and adaptive equalization. Since DA is an efficient computation of an inner product, the disclosed system can also be utilized for signal processing transforms such as a modified discrete cosine transform.

In one embodiment, the DA system 10 the digital input signal may be a digital representation on an analog input signal. For example the DA system 10, may receive an analog input signal that is sampled and represented as plurality of digital bits, or the digital input signal, as described above with reference to FIG. 1A.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A reconfigurable mixed signal distributed arithmetic system comprising:
    an array of tunable voltage references operable for receiving a delayed digital input signal;
    a combination device in electrical communication with the array of tunable floating-gate voltage references that selectively combines an output of the array of tunable voltage references into an analog output signal; and
    a feedback element in electrical communication with the combination device, wherein the array of tunable voltages and the delayed digital input signal combine to perform a distributed arithmetic function and the reconfigurable mixed signal distributed arithmetic system responsively generates the analog output signal.

2. The reconfigurable mixed signal distributed arithmetic system of claim 1, further comprising:
    a shift register in electrical communication with an operable for receiving and delaying a digital input signal and transmitting the delayed digital input signal to the array of tunable voltage references; and
    a sample-and-hold circuit in electrical communication with the combination device operable for sampling and storing the analog output signal.

3. The reconfigurable mixed signal distributed arithmetic system of claim 1, wherein the tunable voltages references comprise a floating-gate transistor and programming circuitry.

4. The reconfigurable mixed signal distributed arithmetic system of claim 3, wherein the tunable voltage references further comprises a low-noise amplifier.

5. The reconfigurable mixed signal distributed arithmetic system of claim 1, wherein the tunable voltage references are tuned the using Fowler-Nordheim tunneling and a hot-electron injection mechanism.

6. The reconfigurable mixed signal distributed arithmetic system of claim 1, wherein the feedback element further comprises an inverting amplifier, a delay element, and a divide-by-two operation.

7. A method for performing mixed signal distributed arithmetic comprising:
    programming analog coefficients to a plurality of circuit elements;
    storing the programmed analog coefficients in a plurality of storage elements;
    outputting delayed analog input signal samples from a feedback signal;
    outputting the stored analog coefficients at a plurality of times;
    summing the selected analog coefficients and delayed analog input signal samples at a plurality of times; and
    sampling and holding a result of the summation.

8. The method for performing mixed signal distributed arithmetic of claim 7, further comprising combining the feedback signal with the delayed analog input signal samples.

9. The method for performing mixed signal distributed arithmetic of claim 8, wherein the feedback signal is the delayed analog input signal samples that has been inverted, delayed, and divided by two.

10. A method for performing mixed signal distributed arithmetic comprising:
    receiving a digital input signal having a plurality of bits;
    storing the digital input signal in a shift register;

generating a plurality of weighted analog signals by combining one or more of the bits of the digital input signal with an array of tunable voltage references;

selectively combining one or more of the plurality of weighted analog signals using a plurality of digital circuit elements; and responsively generating an analog output signal.

11. The method for performing mixed signal distributed arithmetic of claim 10, further comprising combining a feedback signal with the combined plurality of weighted analog signals.

12. The method for performing mixed signal distributed arithmetic of claim 11, wherein the feedback signal is a combined weighted analog signal that has been delayed, inverted, and divided by two.

13. The method for performing mixed signal distributed arithmetic of claim 10, wherein the tunable voltages references comprise a floating-gate transistor and programming circuitry.

14. The method for performing mixed signal distributed arithmetic of claim 10, wherein the tunable voltage references further comprises a low-noise amplifier.

15. The method for performing mixed signal distributed arithmetic of claim 10, wherein the tunable voltage references are tuned by the using Fowler-Nordheim tunneling and a hot-electron injection mechanism.

16. The method of performing mixed signal distributed arithmetic of claim 10, wherein the digital circuit elements comprise a binary value formed by selected bits of the digital input signal which is stored in the shift register.

17. The method for performing mixed signal distributed arithmetic of claim 10, wherein the step of receiving a digital input signal having a plurality of bits further comprises:

receiving an input analog signal; and generating the digital input signal having a plurality of bits responsive to the input analog signal.

18. A reconfigurable mixed signal distributed arithmetic system comprising:

a plurality of storage elements operable for receiving a sampled analog input signal;

a combination device in electrical communication with the plurality of storage elements that selectively combines an output of the plurality of storage elements into an analog output signal; and a feedback element in electrical communication with the combination device, wherein the combination device uses a plurality of digital circuits elements to selectively combine the output of the plurality of storage elements and wherein the plurality of storage elements and the plurality of digital circuits combine to perform a distributed arithmetic function and the reconfigurable mixed signal distributed arithmetic system responsively generates the analog output signal.

* * * * *